US010009017B2

(12) United States Patent
Chou et al.

(10) Patent No.: US 10,009,017 B2
(45) Date of Patent: Jun. 26, 2018

(54) ON-CHIP APPARATUS AND METHOD FOR JITTER MEASUREMENT

(71) Applicant: Faraday Technology Corp., Hsin-Chu (TW)

(72) Inventors: Pei-Yuan Chou, Chia-yi County (TW); Jinn-Shyan Wang, Chia-yi County (TW); Yeong-Jar Chang, Hsin-Chu (TW)

(73) Assignee: Faraday Technology Corp., Hsin-Chu (TW)

( * ) Notice: Subject to any disclaimer, the term of this patent is extended or adjusted under 35 U.S.C. 154(b) by 274 days.

(21) Appl. No.: 14/949,888

(22) Filed: Nov. 24, 2015

(65) Prior Publication Data

US 2016/0363619 A1     Dec. 15, 2016

(30) Foreign Application Priority Data

Jun. 11, 2015   (TW) .............................. 104118853 A

(51) Int. Cl.
| | |
|---|---|
| *G01R 31/02* | (2006.01) |
| *H03L 7/06* | (2006.01) |
| *H03K 5/14* | (2014.01) |
| *G01R 31/317* | (2006.01) |
| *H03K 5/00* | (2006.01) |

(52) U.S. Cl.
CPC .......... *H03K 5/14* (2013.01); *G01R 31/31709* (2013.01); *H03K 2005/00019* (2013.01)

(58) Field of Classification Search
CPC ........... H03K 5/14; H03K 2005/00019; G01R 31/31709
See application file for complete search history.

(56) References Cited

U.S. PATENT DOCUMENTS

| | | | |
|---|---|---|---|
| 2003/0107336 A1 | 6/2003 | Kobayashi | |
| 2007/0096784 A1* | 5/2007 | Hasegawa | H03L 7/07 327/158 |

FOREIGN PATENT DOCUMENTS

| | | |
|---|---|---|
| TW | 234796 | 11/1994 |
| TW | 200518465 | 6/2005 |
| TW | 200723696 | 6/2007 |

\* cited by examiner

*Primary Examiner* — Farhana Hoque
(74) *Attorney, Agent, or Firm* — Winston Hsu

(57) ABSTRACT

An apparatus for jitter measurement includes a first delay circuit, a second delay circuit, and a control circuit. The first delay circuit imposes a preliminary phase delay on an input signal to generate a delayed input signal. The second delay circuit operates with the first delay circuit to impose a fine phase delay on the delayed input signal. The control circuit controls amounts of delays imposed by the first and second delay circuits, and fine tunes the phase delay of the delayed input signal according to the amounts of delays respectively imposed by delay elements of the first and second delay circuits, and estimates or calculates a jitter window for the input signal according to adjustment results of the first and second delay circuits.

24 Claims, 7 Drawing Sheets

ON-CHIP APPARATUS AND METHOD FOR JITTER MEASUREMENT

BACKGROUND OF THE INVENTION

1. Field of the Invention

The present invention relates to a mechanism for jitter measurement, and more particularly, to an apparatus and related method for jitter window measurement.

2. Description of the Prior Art

Generally speaking, the mechanisms at present for measuring the amount of jitter of a clock signal can be categorized into an off-chip measurement mechanism and an on-chip measurement mechanism. The well-known off-chip measurement mechanism uses external equipment to measure jitter of a clock signal of a chip in a circuit package via a series of conducting wires, and a drawback thereof is that the measured jitter window differs from the actual jitter window due to conducting wires affected by the effects of resistors, inductors and capacitors. Therefore, on-chip measurement mechanisms are developed in some devices. A jitter measurement circuit is implemented additionally inside a circuit package, and the jitter measurement circuit is arranged to measure the jitter of a clock signal of a chip and then the digitally encoded results are output to external equipment via conducting wires. The advantage is that the on-chip jitter measurement circuit is free of the effects resulting from resistors, inductors and capacitors.

However, the existing on-chip measurement mechanisms use only delay elements to directly impose a phase delay for an original clock signal to detect the jitter of the clock signal. Under this kind of mechanism, the resolution of the measurement result is subject to the unit delay of the delay element itself and cannot be raised efficiently. Therefore, the existing on-chip measurement mechanisms still cannot more accurately detect the jitter window of the clock signal.

SUMMARY OF THE INVENTION

Therefore, one of the objectives of the present invention is providing an apparatus and method for measuring jitter of a signal to reach the goal of more accurately detecting the jitter window of the clock signal.

An apparatus for jitter measurement is disclosed according to an embodiment of the present invention. The apparatus for jitter measurement comprises a first delay circuit, a second delay circuit and a control circuit. The first delay circuit preliminarily adjusts a phase delay of an input signal to generate a delayed input signal. The second delay circuit is coupled to the first delay circuit, and is arranged to operate with the first delay circuit to fine tune a phase delay of the delayed input signal. The control circuit is coupled to the first delay circuit and the second delay circuit, and is arranged to control and adjust amounts of delays of the first and the second delay circuits, fine tune an amount of delay of the delayed input signal according to a unit delay of a delay element of the first delay circuit and a unit delay of a delay element of the second delay circuit, and estimate or calculate an amount of jitter of the input signal according to an adjustment result of the first delay circuit and an adjustment result of the second delay circuit.

A method for jitter measurement is disclosed according to an embodiment of the present invention. The method comprises: using a first delay circuit to preliminary adjust a phase delay of an input signal to generate a delayed input signal; using a second delay circuit to operate with the first delay circuit to fine tune a phase delay of the delayed input signal; controlling and adjusting amounts of delays of the first and the second delay circuits, and fine tuning an amount of delay of the delayed input signal according to a unit delay of a delay element of the first delay circuit and a unit delay of a delay element of the second delay circuit; and estimating or calculating an amount of jitter of the input signal according to an adjustment result of the first delay circuit and an adjustment result of the second delay circuit.

According to an embodiment of the present invention, an apparatus for jitter measurement imposes a coarse phase delay on the input clock signal by means of coarsely tuning the phase of the input clock signal at first, and subsequently uses two different types of delay elements having different unit delays to turnoff a delay element previously turned on and turn on another delay element previously turned off, such that a delay difference between two unit delays of different types of delay elements is used to fine tune the phase of the input clock signal that has been coarsely tuned to thereby more precisely approach the jitter window of the original input clock signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
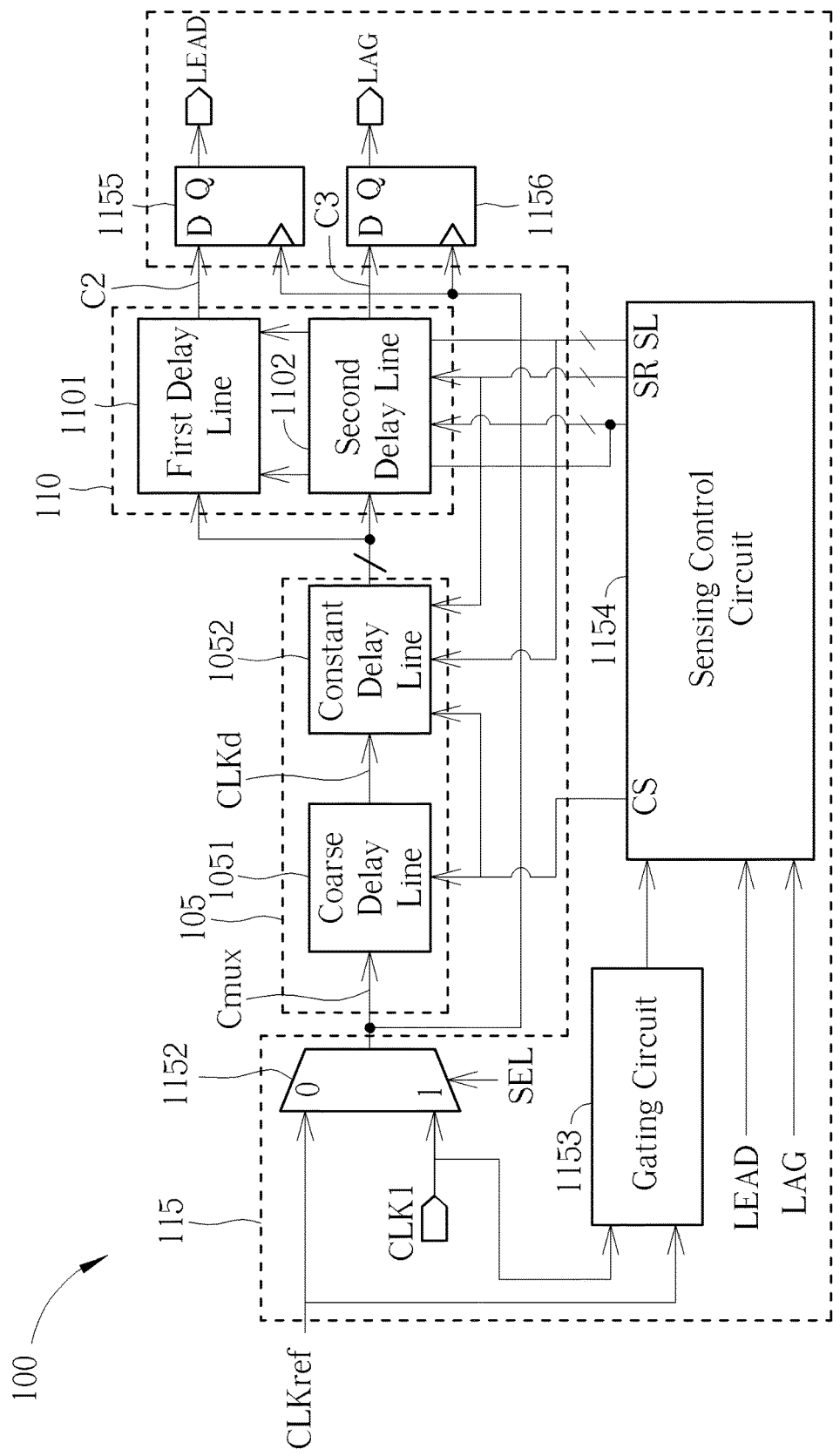
FIG. 1 is a schematic diagram of an apparatus for measuring the jitter of an input clock signal CLK1 according to the first embodiment of the invention.

Please refer to FIG. 1, which is a schematic diagram of an apparatus 100 for measuring the amount of jitter of the input clock signal CLK1 (signal CLK1 is a signal under test) according to a first embodiment of the present invention. The apparatus 100 includes a first delay circuit 105, a second delay circuit 110 and a control circuit 115. The first delay circuit 105 imposes a preliminary phase delay on the input signal CLK1 to generate a delayed input signal CLKd. The second delay circuit 110 is coupled to the first delay circuit 105, and operates with the first delay circuit 105 to impose a fine phase delay adjustment (fine tune the amount of phase delay) for the delayed input signal CLKd. The control circuit 115 is coupled to the first delay circuit 105 and the second delay circuit 110, and is used to control and adjust the amount of delay of the first delay circuit 105 and the amount of delay of the second delay circuit 110, fine tune the amount of delay of the delayed input signal CLKd step by step according to a unit delay of a delay element of the first delay circuit 105 and a unit delay of a delay element of the second delay circuit 110, and estimate or calculate an actual jitter window of the input signal CLK1 according to the adjustment result of the first delay circuit 105 and the adjustment result of the second delay circuit 110. It should be noted that the apparatus 100 applies a phase delay adjustment to the input signal CLK1 via a hierarchical adjustment mechanism to thereby estimate the amount of jitter. Firstly, the apparatus 100 preliminarily adjusts the phase of the input signal CLK1 via a coarse tuning. In the following adjustment stages, the apparatus 100 fine tunes the phase of the input signal CLK1 step by step via a difference between delays of two different delay elements. In other words, different step-sizes are used one after another to adjust the phase of the input signal CLK1, such that a more precise estimation results may be obtained.

In practice, the first delay circuit 105 includes a coarse delay line 1051 and a constant delay line 1052. The coarse delay line 1051 has a plurality of series-connected coarse delay elements, and the constant delay line 1052 has a plurality of series-connected constant delay elements. Each coarse delay element has a coarse unit delay to impose a coarse unit phase delay on the input signal CLK1, and each constant delay element has a constant unit delay to impose a constant unit phase delay on the input signal CLK1, wherein the coarse unit delay is different from the constant unit delay. In the preset embodiment, the coarse unit delay is designed to be larger than the constant unit delay. Furthermore, the second delay circuit 110 includes a first delay line 1101 and a second delay line 1102. The first delay line 1101 has a plurality of series-connected first delay elements each having a first unit delay, and the second delay line 1102 has a plurality of series-connected second delay elements each having a second unit delay. Furthermore, the control circuit 115 includes a multiplexer 1152, a gating circuit 1153, a sensing control circuit 1154 and D-type latches 1155, 1156. The multiplexer 1152 receives a mode select signal SEL to select the input clock signal CLK1 or a reference clock signal CLKref as an output signal Cmux. The mode select signal SEL may be generated by an external circuit of the apparatus 100 or may be controlled by the sensing control circuit 1154. In the present embodiment, the apparatus 100 may operate in one of a calibration mode and a measurement mode. When operating in the calibration mode, the mode select signal SEL is '0', and the multiplexer 1152 selects the reference clock signal CLKref as an input of the following first delay circuit 105. Assume that the jitter introduced by the multiplexer 1152 can be ignored, and the reference clock signal CLKref is an ideal clock without signal jitter. Hence, the output signal Cmux does not have signal jitter either, and at this moment, the apparatus 100 is arranged to use the jitter-free output signal Cmux to estimate/calculate the unit delays of different delay elements in the following circuits. When operating in the measurement mode, the mode select signal SEL is '1', and the multiplexer 1152 selects the input clock signal CLK1 as an input of the following first delay circuit 105. Assume that the jitter introduced by the multiplexer 1152 can be ignored. Hence, the amount of jitter of the clock signal under test CLK1 is equal to the amount of jitter of the output signal Cmux, and at this moment, the apparatus 100 is arranged to detect the amount of jitter of the output signal Cmux to measure the actual amount of jitter of the signal under test that is generated by an internal circuit of a chip. The details of the calibration mode and the measurement mode are described in the following paragraphs.

Furthermore, the gating circuit 1153 is arranged to gate off the reference clock signal CLKref or the input signal under test CLK1 output to the sensing control circuit 1154 after the apparatus 100 finishes the jitter measurement, such that the sensing control circuit 1154 does not operate to thereby reduce the operating power of the whole circuits. When a jitter measurement is needed next time, the gating circuit 1153 may transmit the received reference clock signal CLKref or the input signal under test CLK1 to the sensing control circuit 1154 to make the sensing control circuit 1154 operate. The D-type latch 1155 is arranged to receive the output of the multiplexer 1152 and the output of the first delay line 1101. Assume that delay and jitter introduced by the multiplexer 1152 can be ignored. When operating in a calibration mode, the D-type latch 1155 is arranged to compare phases of the reference clock signal CLKref and the signal result C2 of the first delay line 1101 to generate a first comparison result LEAD which indicates that the signal result C2 is leading or lagging behind the reference clock signal CLKref. When operating in a measurement mode, the D-type latch 1155 is arranged to compare phases of a test signal (i.e. signal CLK1) and the signal result C2 of the first delay line 1101 to generate the first comparison result LEAD which indicates that the signal result C2 is leading or lagging behind the test signal CLK1. The D-type latch 1156 is arranged to receive the output of the multiplexer 1152 and the output of the second delay line 1102. When operating in a calibration mode, the D-type latch 1156 is arranged to compare phases of the reference clock signal CLKref and the signal result C3 of the second delay line 1102 to generate a second comparison result LAG which indicates that the signal result C3 is leading or lagging behind the reference clock signal CLKref. When operating in a measurement mode, the D-type latch 1156 is arranged to compare phases of a test signal CLK1 and the signal result C3 of the second delay line 1102 to generate a second comparison result LAG which indicates that the signal result C3 is leading or lagging behind the test signal CLK1.

Furthermore, it should be noted that the delay difference between the aforementioned constant unit delay and the first unit delay is smaller than the coarse unit delay, and the delay difference between the constant unit delay and the second unit delay is also smaller than the coarse unit delay. For example, the coarse unit delay may be a design selection of 10 picoseconds, 25 picoseconds or 50 picoseconds, and the delay difference between the constant unit delay and the first unit delay and the delay difference between the constant unit delay and the second unit delay may be respectively designed to be 2.3 picoseconds and 2.4 picoseconds, or the two delay differences may be respectively designed to be 2.9 picoseconds and 7.7 picoseconds. It should be noted that the delay difference between the constant unit delay and the first unit delay and the delay difference between the constant unit delay and the second unit delay are both smaller than the coarse unit delay. The delay differences are determined by the resolution desired by the circuits, and only need to be smaller than the coarse unit delay. The delay differences are not determined by the size of coarse delay. The delay settings given above are only for describing the differences of different phase adjustment step-sizes of a coarse-tuning and a fine-tuning imposed by the present invention, and are not meant to be limitations of the present invention. In a measurement mode of the present embodiment, the control circuit 115 first controls the series-connected coarse delay elements in the coarse delay line 1051 and the series-connected constant delay elements in the constant delay line 1052 to impose a preliminary phase delay (coarse phase adjustment) on the input signal CLK1, and subsequently imposes a fine phase adjustment on the input signal CLK1 according to a delay difference between the constant unit delay and the first unit delay and a delay difference between the constant unit delay and the second unit delay. The resolution of jitter measurement is determined by the two delay differences. The larger value of the two delay differences is selected as the resolution of the aforementioned jitter measurement mechanism of the present invention.

A measurement mode is first described as below. Please refer to FIG. 2A and FIG. 2B, which are schematic diagrams of operations performed by the apparatus 100 in FIG. 1 for imposing a phase delay adjustment on an input signal CLK1 to estimate a jitter window. Firstly, the control circuit 115 controls and adjusts the coarse delay line 1051 and the constant delay line 1052 of the first delay circuit 105. The control circuit 115 controls the numbers of delay elements turned on by the coarse delay line 1051 and the constant delay line 1052, respectively, such that a preliminary phase adjustment (i.e. coarse phase adjustment) is imposed on the input signal CLK1 to make the delayed input signal CLKd like C1 illustrated in FIG. 2A and move rightwards to approach the transition point of the input signal under test CLK1 with a larger step-size. Next, the control circuit 115 controls and adjusts the first delay line 1101 and the second delay line 1102 of the second delay circuit 110. The control circuit 115 controls the numbers of delay elements turned on by the constant delay line 1052, the first delay line 1101 and the second delay line 1102, respectively, such that a subsequent second stage phase adjustment (i.e. fine phase adjustment) is imposed on the input signal under test CLK1, wherein a phase delay made by each first delay element is earlier than a phase delay made by each constant delay element, and a phase delay made by each second delay element is later than a phase delay made by each constant delay element. The delay difference between the constant unit delay and the first unit delay is t1, and the delay difference between the constant unit delay and the second unit delay is t2. Namely, if a phase delay made by a constant delay element is t, a phase delay made by a first delay element is t−t1, and a phase delay made by a second delay element is t+t2, where the amount of phase delay of t−t1 is smaller than the phase delay t, and the amount of phase delay of t+t2 is larger than the phase delay t.

Figure 2A:
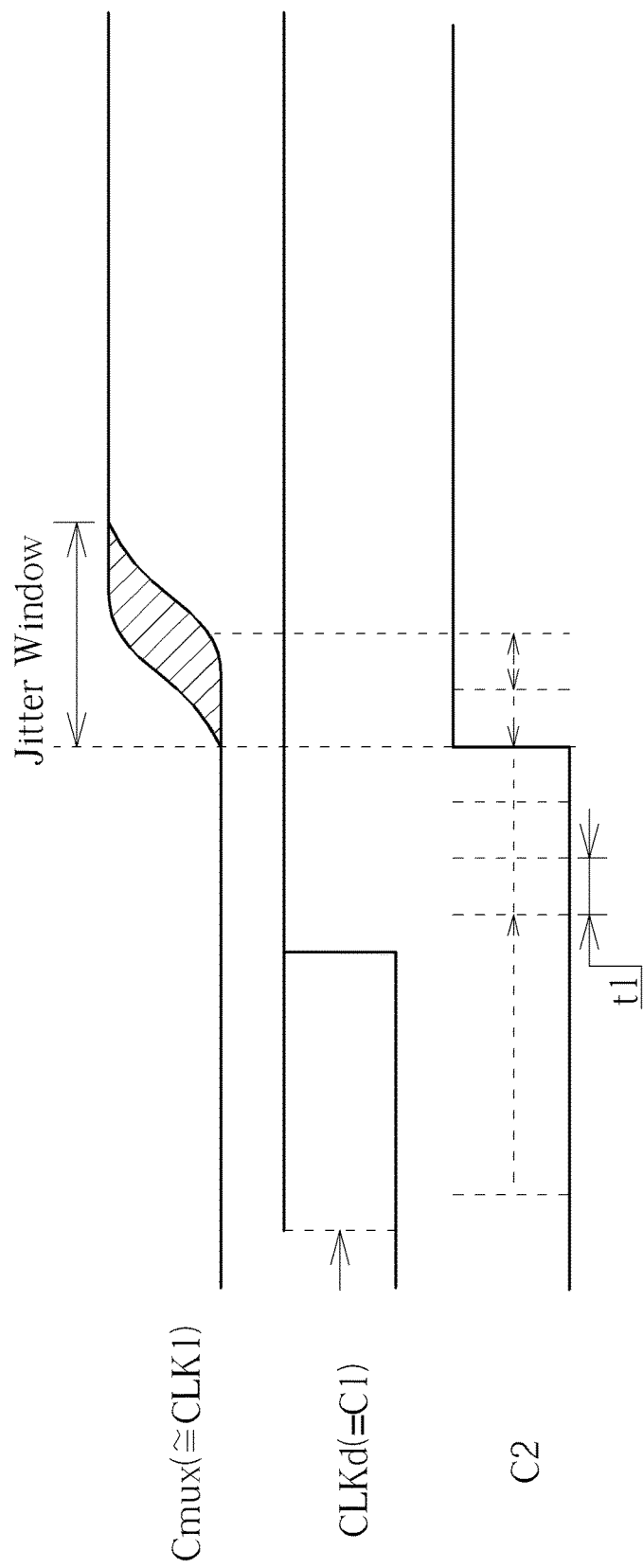
FIG. 2A and FIG. 2B are schematic diagrams of operations performed by the apparatus in FIG. 1 for imposing a phase delay adjustment on an input signal CLK1 to estimate a jitter window.

In the preliminary phase delay adjustment, the sensing control circuit 1154 firstly determines the turn-on numbers of the coarse delay elements in the coarse delay line 1051 and the turn-on numbers of the constant delay elements in the constant delay line 1052, such that the input signal CLKd is like C1 illustrated in FIG. 2A and moves rightwards to approach the transition point (i.e. a point of a time when a jitter of signal CLK1 takes place) of the input signal under test Cmux until C2 changes from being leading CLK1 to being lagging behind CLK1. In the subsequent phase delay adjustment, the sensing control circuit 1154 does not change the turn-on numbers of the coarse delay elements, but turns off a constant delay element and turns on a first delay element at the same time in a step-by-step manner. Due to the fact that the phase delay made by each first delay element is earlier than the phase delay made by each constant delay elements and a delay difference of t1 exists, the input signal CLKd is like C2 illustrated in FIG. 2A and has each unit phase delay t1 illustrated by dotted line, and changes from being lagging behind CLK1 to being leading CLK1. As far as the operations of circuits are concerned, when C2 begins to change from being leading CLK1 to being lagging behind CLK1, the output of the D-type latch 1155 changes from '1' to '0', and the sensing control circuit 1154 locks and obtains a CS value used for controlling the coarse delay line 1051.

Next, the sensing control circuit 1154 adjusts the constant delay elements and the first delay elements step by step, such that C2 changes from being lagging behind CLK1 to being leading CLK1. At this moment, the output of the D-type latch 1155 changes from '0' to '1', and the sensing control circuit 1154 locks and obtains an SL value (may be regarded as a first fine-tuning value) used for controlling the constant delay line 1052 and the first delay line 1101. The SL value that is capable of making C2 change from being lagging behind CLK1 to being leading CLK1 in the first-time fine-tuning of the constant delay element and the first delay element may be set to be an SL baseline. Therefore, when approaching the transition point of the input signal CLK1, the control circuit 115 may record the required turn-on numbers of the coarse delay elements, the turn-on numbers of the constant delay elements and the turn-on numbers of the first delay elements by recording the CS value and the SL value. Furthermore, after recording the numbers, if C2 changes from being leading CLK1 to being lagging behind CLK1 during N periods of the signal under test CLK1, the SL value generated by the sensing control circuit 1154 is changed. Hence, a constant delay element is turned off and a first delay element is turned on at the same time, thereby making C2 lead CLK1 again to enlarge the left part of the jitter window. However, if C2 does not change from being leading CLK1 to being lagging behind CLK1, the SL value keeps unchanged. After N periods, SL values are recorded. According to the amount of change ΔSL (an amount of change obtained by comparing SL with SL baseline) of each SL value output by the control circuit, the maximum value among the amounts of change ΔSL of SL values is multiplied by the delay difference t1 between the constant unit delay and the first unit delay to obtain an amount of jitter of a signal moving rightwards (i.e. the left part of a jitter window).

Figure 2B:
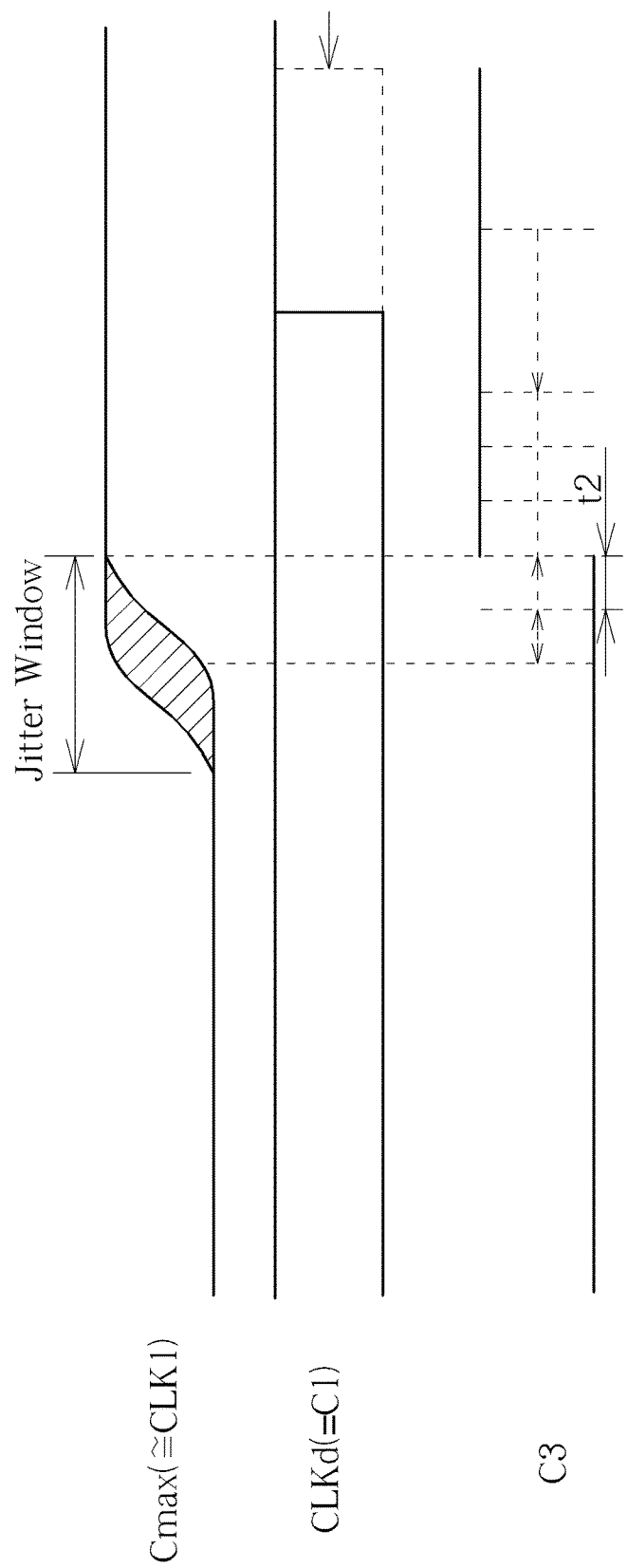

Furthermore, after determining the left part of a jitter window, the control circuit 115 starts determining the turn-on numbers of the coarse delay elements in the coarse delay line 1051 and the turn-on numbers of the constant delay elements in the constant delay line 1052 again, such that the signal CLKd is like C1 illustrated in FIG. 2B and moves leftwards to approach the same transition point (i.e. a transition point of the signal CLK1) of the input signal Cmux until C3 changes from being lagging behind CLK1 to being leading CLK1. Next, in the subsequent phase delay adjustment, the control circuit 115 does not change the turn-on numbers of the coarse delay elements, but turns off a constant delay element and turns on a second delay element at the same time in a step-by-step manner. Due to the fact that the phase delay made by each second delay element is later than the phase delay made by each constant delay element and a delay difference of t2 exists, the delayed input signal CLKd is like C3 illustrated in FIG. 2B, and C3 changes from being leading CLK1 to being lagging behind CLK1. As far as the operations of circuits are concerned, when C3 begins to change from being lagging behind CLK1 to being leading CLK1, the output of the D-type latch 1156 changes from '0' to '1', and the sensing control circuit 1154 locks and obtains a CS value used controlling the coarse delay line 1051. Next, the sensing control circuit 1154 adjusts the constant delay elements and the second delay elements step by step, such that C3 changes from being leading CLK1 to being lagging behind CLK1. At this moment, the output of the D-type latch 1156 changes from '1' to '0', and the sensing control circuit 1154 locks and obtains an SR value (may be regarded as a second fine-tuning value) used controlling the constant delay line 1052 and the second delay line 1102. The SR value that is capable of making C3 change from being leading CLK1 to being lagging behind CLK1 in the first-time fine-tuning of the constant delay element and the second first delay element criterion may be set to be an SR baseline. Therefore, when most closely approaching the transition point of the input signal CLK1, the control circuit 115 may record the turn-on numbers of the coarse delay elements, the turn-on numbers of the constant delay elements and the turn-on numbers of the second delay elements by recording the CS value and the SR value. Furthermore, after recording the numbers, if C3 changes from being lagging behind CLK1 to being leading CLK1 during N periods of the signal under test CLK1, the SR value generated by the sensing control circuit 1154 is changed. Hence, a constant delay element is turned off and a second delay element is turned on at the same time, thereby making C3 lag behind CLK1 again to enlarge the right part of the jitter window. However, if C3 does not change from being lagging behind CLK1 to being leading CLK1, the SR value keeps unchanged. After N periods, SR values are recorded. According to the amount of change ΔSR (an amount of change obtained by comparing SR with SR baseline) of each SR value output by the control circuit, the maximum value among the amounts of change ΔSR of SR values is multiplied by the delay difference t2 between the constant unit delay and the second unit delay to obtain an amount of jitter of a signal moving rightwards (i.e. the right part of a jitter window). Finally, the control circuit 315 may precisely estimate and calculate that the amount of clock jitter of the input signal CLK1 is the sum of the amount of jitter of signal moving rightwards (i.e. the left part of jitter window) and the amount of jitter of signal moving leftwards (i.e. the right part of jitter window). Therefore, according to the amount of change of SL during N measurement periods (an amount of change of the turn-on numbers of the first delay elements during N measurement periods), the amount of change of SR during N measurement periods (an amount of change of the turn-on numbers of the second delay elements during N measurement periods), the delay difference t1 between the constant unit delay and the first unit delay and the delay difference t2 between the constant unit delay and the second unit delay, the control circuit 115 may precisely estimate and calculate the amount of jitter of the input signal CLK1. In the design of the present embodiment, the amounts of phase delays made respectively by the constant delay elements, the first delay elements and the second delay elements are substantially multiple times larger than the phase delay difference t1, t2. Therefore, compared with using only phase delay of a delay element to estimate and calculate a clock jitter, approaching from right to left via the phase delay difference t1 of different delay elements and approaching from left to right via the phase delay difference t2 of different delay elements may be used to precisely estimate and calculate an actual occurrence window of a clock jitter.

In addition, in another embodiment, delay elements of the same type may be used to implement the coarse delay elements and the constant delay elements. Please refer to FIG. 3, which is a schematic diagram of an apparatus 300 for measuring the jitter of the input clock signal CLK1 according to a second embodiment of the present invention. The apparatus 300 includes a first delay circuit 305, a second delay circuit 310 and a control circuit 305. The first delay circuit 305 is arranged to impose a preliminary phase delay on the input clock signal under test CLK1 to generate a delayed input signal CLKd. The second delay circuit 310 is coupled to the first delay circuit 305, and is arranged to impose a fine phase delay on the delayed input signal CLKd. The control circuit 315 is coupled to the first delay circuit 305 and the second delay circuit 310, and is arranged to control and adjust the amount of delay of the first delay circuit 305, fine tune the amount of delay of the delayed input signal CLKd according to a unit delay of a delay element of the first delay circuit 305 and a unit delay of a delay element of the second delay circuit 310, and estimate/calculate an amount of jitter of the input signal CLK1 according to the adjustment result of the first delay circuit 305 and the adjustment result of the second delay circuit 310.

In practice, the first delay circuit 305 comprises a coarse delay line 3051 and a constant delay line 3052. Both of the coarse delay line 3051 and the constant delay line 3052 include a plurality of constant delay elements DE1 of the same type that are connected in series. Each constant delay element has a constant unit delay, and is arranged to impose a preliminary phase delay on the input signal. In a preliminary phase delay adjustment, the sensing control circuit 3154 firstly determines the turn-on numbers of the constant delay elements in the coarse delay line 3051 and the constant delay line 3052, such that the delayed input signal CLKd is like C1 illustrated in FIG. 2A and moves rightwards to approach the transition point (i.e. a point of time when a jitter of signal CLK1 takes place) of the input signal under test CLK1 until C2 changes from being leading CLK1 to being lagging behind CLK1. In the subsequent phase delay adjustment, the sensing control circuit 3154 turns off a constant delay element (DE1) and turns on a first delay element (DE2) at the same time in a step-by-step manner. Due to the fact that the phase delay made by each first delay element is earlier than the phase delay made by each constant delay element and a delay difference of t1 exists, the input signal CLKd is like C2 illustrated in FIG. 2A, and has each unit phase delay t1 illustrated by dotted line, and changes from being lagging behind CLK1 to being leading CLK1. As far as the operations of circuits are concerned, when C2 begins to change from being leading CLK1 to being lagging behind CLK1, the output of the D-type latch 3155 changes from '1' to '0', and the sensing control circuit 3154 locks and obtains a CS value used for controlling the coarse delay elements. Next, the sensing control circuit 3154 adjusts the constant delay elements and the first delay elements step by step, such that C2 changes from being lagging behind CLK1 to being leading CLK1. At this moment, the output of the D-type latch 3155 changes from '0' to '1', and the sensing control circuit 3154 locks and obtains an SL value (may be regarded as a first fine-tuning value) used for controlling the constant delay elements and the first delay line 3101. The SL value that is capable of making C2 change from being lagging behind CLK1 to being leading CLK1 in the first-time fine-tuning of the constant delay elements and the first delay elements may be set to be an SL baseline. Therefore, when approaching the transition point of the input signal under test CLK1, the control circuit 315 may record the required turn-on numbers of the constant delay elements and the turn-on numbers of the first delay elements by recording the CS value and the SL value. Furthermore, after recording the CS value and SL value, if C2 changes from being leading CLK1 to being lagging behind CLK1 during N periods of the input clock signal under test CLK1, the SL value generated by the sensing control circuit 3154 is changed. Hence, a constant delay element is turned off and a first delay element is turned on at the same time, thereby making C2 lead CLK1 again to enlarge the left part of the jitter window. However, if C2 does not change from being leading CLK1 to being lagging behind CLK1, the SL value keeps unchanged. After N periods, SL values are recorded. According to the amount of change ΔSL (an amount of change obtained by comparing SL with SL baseline) of each SL value output by the control circuit, the maximum value among the amounts of change ΔSL of SL values is multiplied by the delay difference t1 between the constant unit delay and the first unit delay to obtain an amount of jitter of a signal moving rightwards (i.e. the left part of a jitter window).

Furthermore, after determining the left part of a jitter window, the sensing control circuit 3154 starts determining the turn-on numbers of the constant delay elements, such that the delayed input signal CLKd is like C1 illustrated in FIG. 2B and moves leftwards to approach the same transition point of the input signal under test CLK1 until C3 changes from being lagging behind CLK1 to being leading CLK1. Next, in the subsequent phase delay adjustment, the sensing control circuit 3154 turns off a constant delay element (DE1) and turns on a second delay element (DE3) at the same time in a step-by-step manner. Due to the fact that the phase delay made by each second delay element is later than the phase delay made by each constant delay element and a delay difference of t2 exists, the input signal under test CLKd is like C3 illustrated in FIG. 2B, and changes from being leading CLK1 to being lagging behind CLK1. As far as the operations of circuits are concerned, when C3 begins to change from being lagging behind CLK1 to being leading CLK1, the output of the D-type latch 3156 changes from '0' to '1', and the sensing control circuit 3154 locks and obtains a CS value used for controlling the constant delay elements. Next, the sensing control circuit 3154 adjusts the constant delay elements and the second delay elements step by step, such that C3 changes from being leading CLK1 to being lagging behind CLK1. At this moment, the output of the D-type latch 3156 changes from '1' to '0', and the sensing control circuit 3154 locks and obtains an SR value (may be regarded as a second fine-tuning value) used for controlling the constant delay elements and the second delay line 3102. The SR value that is capable of making C3 change from being leading CLK1 to being lagging behind CLK1 in the first-time fine-tuning of the constant delay elements and the second delay elements may be set to be an SR baseline. Therefore, when most closely approaching the transition point of the input signal under test CLK1, the control circuit 315 may record the required turn-on numbers of the constant delay elements and the turn-on numbers of the second delay elements by recording the CS value and the SR value. Furthermore, after recording the CS value and SR value, if C3 changes from being lagging behind CLK1 to being leading CLK1 during N periods of the input clock signal under test CLK1, the SR value generated by the sensing control circuit 3154 is changed. Hence, a constant delay element is turned off and a second delay element is turned on at the same time, thereby making C3 lag behind CLK1 again to enlarge the right part of the jitter window. However, if C3 does not change from being lagging behind CLK1 to being leading CLK1, the SR value keeps unchanged. After N periods, SR values are recorded. According to the amount of change ΔSR (an amount of change obtained by comparing SR with SR baseline) of each SR value output by the control circuit, the maximum value among the amounts of change ΔSR of SR values is multiplied by the delay difference t2 between the constant unit delay and the second unit delay to obtain an amount of jitter of a signal moving leftwards (i.e. the right part of a jitter window). Finally, the control circuit 315 may precisely estimate and calculate that the amount of clock jitter of the input signal CLK1 is the sum of the amount of jitter of signal moving rightwards (i.e. the left part of jitter window) and the amount of jitter of signal moving leftwards (i.e. the right part of jitter window). Therefore, according to the adjustment result of an approach from right to left and the adjustment result of an approach from left to right, the control circuit 315 may precisely estimate and calculate the amount of clock jitter of the input signal CLK1. In the design of the present embodiment, the amounts of phase delays made respectively by the constant delay elements, the first delay elements and the second delay elements are substantially multiple times larger than the values of phase delay difference t1, t2. Therefore, compared with using only a unit phase delay of a delay element to estimate and calculate a clock jitter, approaching from left to right via the phase delay difference t1 of different delay elements and approaching from right to left via the phase delay difference t2 of different delay elements may be used to precisely estimate and calculate an actual occurrence window of clock jitter.

Figure 5A:
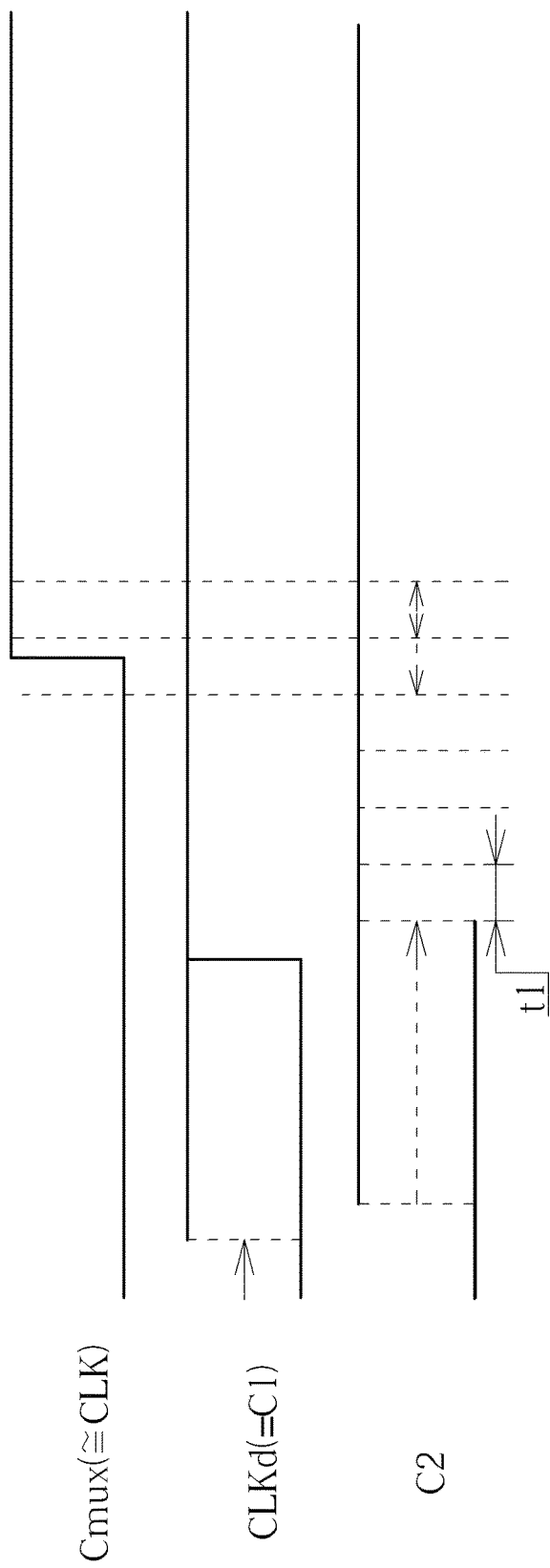
FIG. 5A and FIG. 5B are schematic diagrams of operations performed by an apparatus of an embodiment of the invention that operates in a calibration mode for using a reference clock signal to detect a unit delay of each delay element.
Figure 5B:
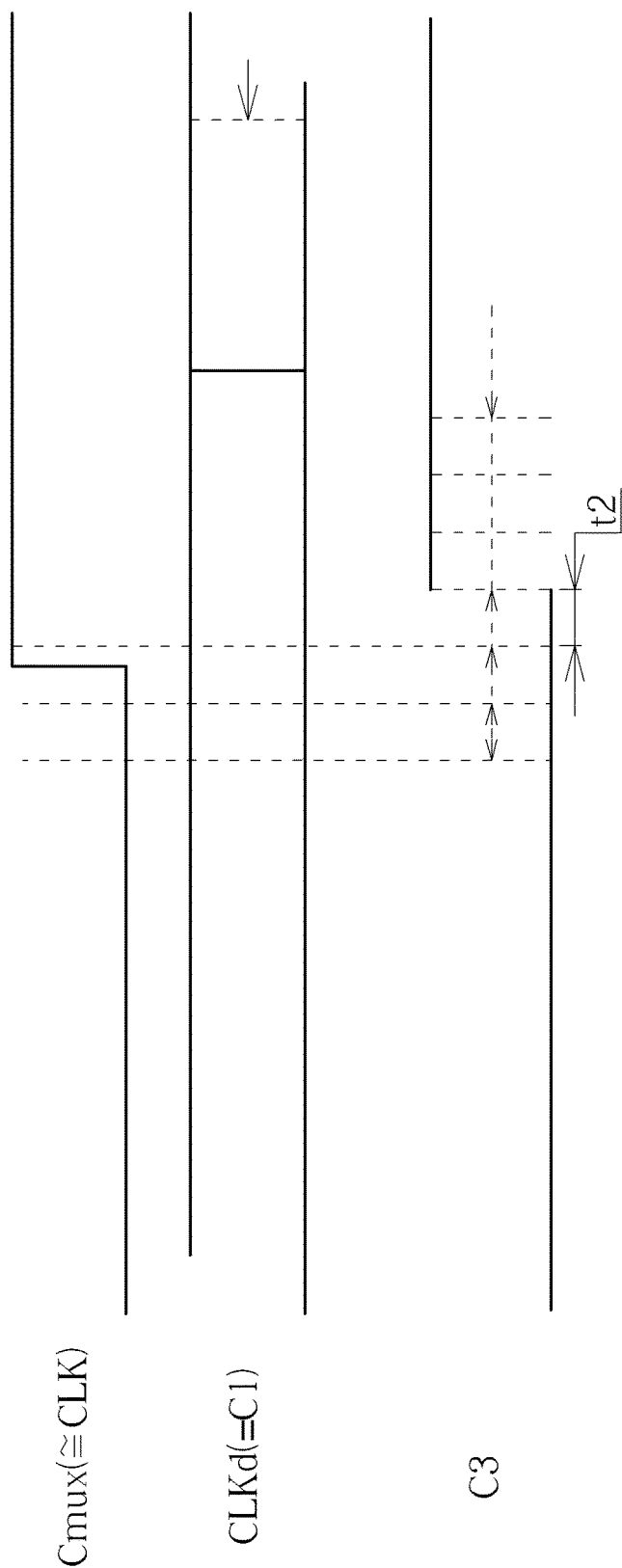

In addition, the aforementioned apparatus 100/300 has a calibration mode and a measurement mode. When operating in a measurement mode, the apparatus 100/300 performs a clock jitter estimation and calculation for the input signal CLK1, as described above. When operating in a calibration mode, in order to raise the estimation accuracy, the apparatus 100/300 receives a reference clock signal CLKref, which is an ideal clock signal and is assumed to substantially have no signal jitter. The control circuit 115/315 repeatedly executes approaching from left to right and approaching from right to left, as illustrated in FIG. 5A and FIG. 5B, to respectively approach the signal transition point of the reference clock signal CLKref in a calibration mode. Compared with a measurement mode, the calibration mode does not perform the operation of measuring jitter in N periods. After repeatedly execution of approaching from left to right and approaching from right to left, multiple CS values, multiple SL values and multiple SR values are obtained, and then the average of CS values, the average of SL values and the average of SR values are calculated to be the results for finally controlling the aforementioned delay lines, and a unit delay of a delay element in the circuit is calculated accordingly. In real calculation, due to the fact that the unit phase delays of the four different delay elements need to be calibrated in the first embodiment, four different reference clock signals CLKref (with different frequencies and periods) are input to the apparatus 100 to obtain a group of four simultaneous equations that can be solved for finding the unit phase delays of the four different delay elements (coarse delay element, constant delay element, first delay element, second delay element). In practice, it is assumed that four different reference clock signals CLKref respectively have four different periods of T1, T2, T3 and T4. As far as the embodiment illustrated in FIG. 1 is concerned, it is assumed that W is a unit delay of a coarse delay element, X is a unit delay of a constant delay element, Y is a unit delay of a first delay element, Z is a unit delay of a second delay element and t3 is other delay. The four different periods T1, T2, T3, T4 may be represented using the following four equations:

$$T1 = a1 \times X + b1 \times Y + c1 \times W + t3 = d1 \times X + e1 \times Z + f1 \times W + t3;$$

$$T2 = a2 \times X + b2 \times Y + c2 \times W + t3 = d2 \times X + e2 \times Z + f2 \times W + t3;$$

$$T3 = a3 \times X + b3 \times Y + c3 \times W + t3 = d3 \times X + e3 \times Z + f3 \times W + t3;$$

$$T4 = a4 \times X + b4 \times Y + c4 \times W + t3 = d4 \times X + e4 \times Z + f4 \times W + t3;$$

wherein a1-a4, b1-b4, c1-c4, d1-d4, e1-e4, and f1-f4 are the turn-on numbers of the delay elements under different situations, which are obtained by the control circuit 115 after the preliminary phase delay adjustment and the follow-up phase adjustment and are all known values. Therefore, as can be known from the group of four simultaneous equations described above, there are only four variables, and the values of W, X, Y, Z may be calculated to thereby estimate the unit delay of the coarse delay element, the unit delay of the constant delay element, the unit delay of the first delay element and the unit delay of the second delay element.

Figure 3:
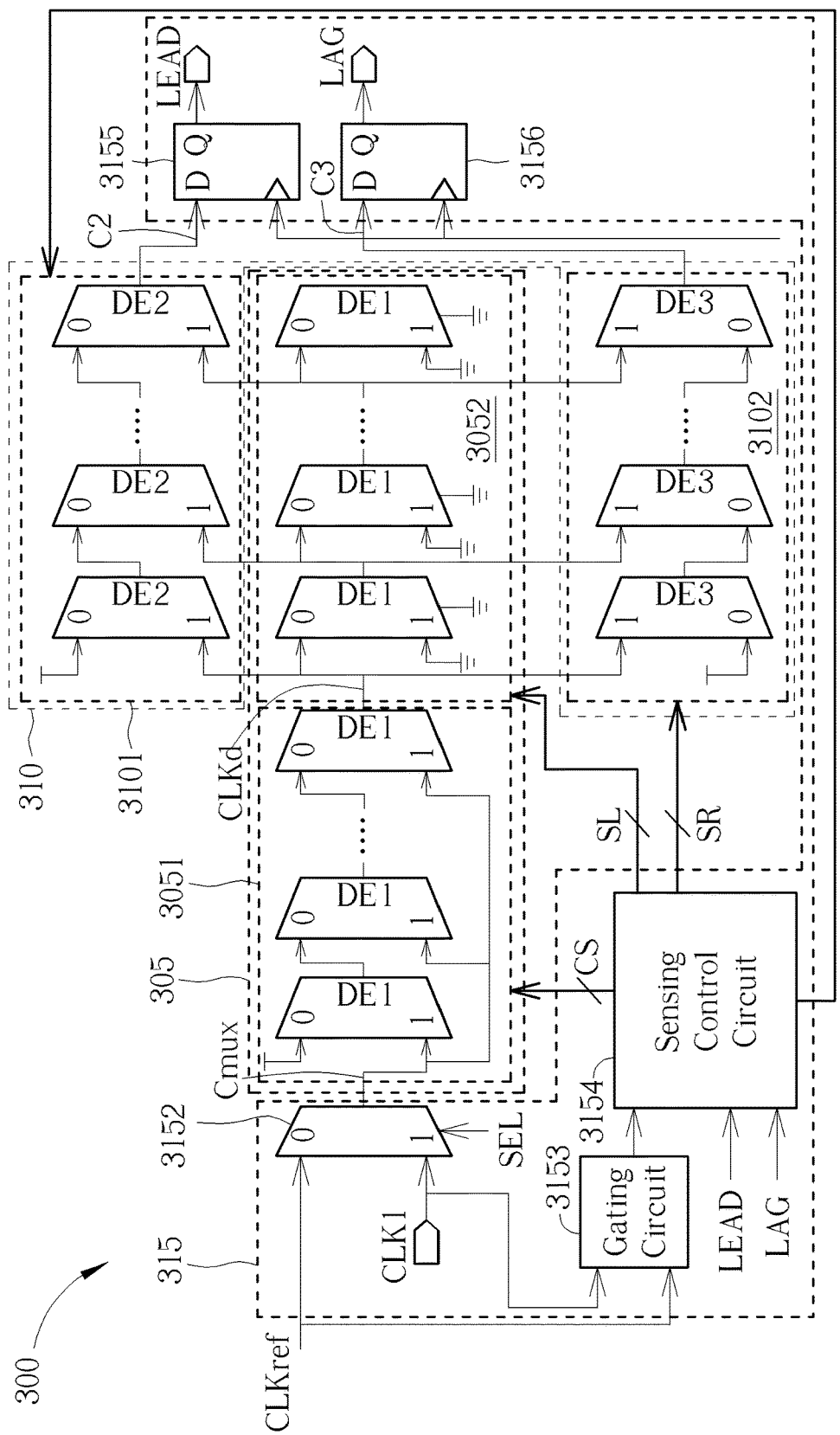
FIG. 3 is a schematic diagram of an apparatus for measuring the jitter of an input clock signal CLK1 according to the second embodiment of the invention.

Furthermore, since the unit phase delays of three different delay elements need to be calibrated in the second embodiment, three different reference clock signals CLKref (with different frequencies and periods) are input to the apparatus 300 to obtain a group of three simultaneous equations that can be solved for finding the unit phase delays of three different delay elements (constant delay element, first delay element, second delay element). In practice, it is assumed that three different reference clock signals CLKref have three different periods of T1, T2, and T3, respectively. As far as the embodiment illustrated in FIG. 3 is concerned, it is assumed that X is a unit delay of a constant delay element, Y is a unit delay of a first delay element, Z is a unit delay of a second delay element and t3 is other delay. The three different periods T1, T2, and T3 may be represented using the following three equations:

$$T1 = a1 \times X + b1 \times Y + t3 = c1 \times X + d1 \times Z + t3;$$

$$T2 = a2 \times X + b2 \times Y + t3 = c2 \times X + d2 \times Z + t3;$$

$$T3 = a3 \times X + b3 \times Y + t3 = c3 \times X + d3 \times Z + t3;$$

wherein a1-a3, b1-b3, c1-c3, and d1-d3 are the turn-on numbers of delay elements under different situations, which are obtained by the control circuit 315 after the preliminary phase delay adjustment and the follow-up phase adjustment and are all known values. Therefore, as can be known from the group of three simultaneous equations described above, there are only three variables, and the values of X, Y, Z may be calculated to thereby estimate the unit delay of the constant delay element, the unit delay of the first delay element and the unit delay of the second delay element.

Figure 4:
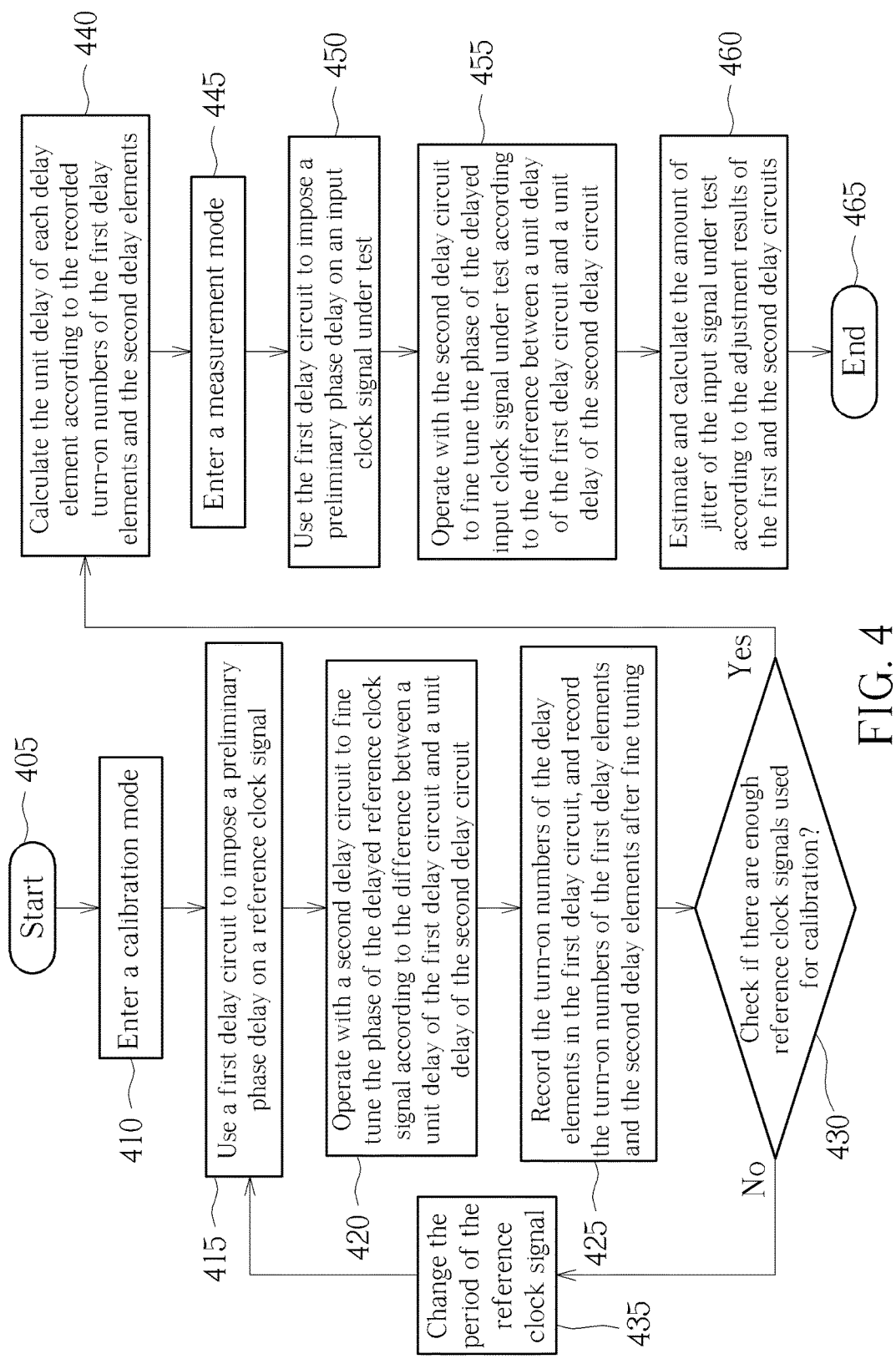
FIG. 4 is an operation flowchart of an embodiment of the invention.

In addition, to make a reader more easily understand the technology spirit of the present invention, please refer to FIG. 4, which is an operation flowchart of an embodiment of the present invention. If the result is substantially the same, there is no need to follow the exact order of steps illustrated in FIG. 4, and the steps illustrated in FIG. 4 are not required to be executed continuously in sequence, i.e., other steps may be inserted in between. The steps of the flowchart are illustrates as follows.

Step 405: Start;
Step 410: Enter a calibration mode;
Step 415: Use a first delay circuit to impose a preliminary phase delay on a reference clock signal;
Step 420: Operate with a second delay circuit to fine tune the phase of the delayed reference clock signal according to the difference between a unit delay of the first delay circuit and a unit delay of the second delay circuit;
Step 425: Record the turn-on numbers of the delay elements in the first delay circuit, and record the turn-on numbers of the first delay elements and the second delay elements after fine tuning;
Step 430: Check if there are enough reference clock signals used for calibration. If yes, proceed to step 440; otherwise, proceed to step 435;
Step 435: Change the period of the reference clock signal;
Step 440: Calculate the unit delay of each delay element according to the recorded turn-on numbers of the first delay elements and the second delay elements;
Step 445: Enter a measurement mode;
Step 450: Use the first delay circuit to impose a preliminary phase delay on an input clock signal under test;
Step 455: Operate with the second delay circuit to fine tune the phase of the delayed input clock signal under test according to the difference between a unit delay of the first delay circuit and a unit delay of the second delay circuit;
Step 460: Estimate and calculate the amount of jitter of the input signal under test according to the adjustment results of the first and the second delay circuits;
Step 465: End.

Furthermore, the first delay circuit 105/305 may have a function of process detection, namely, may be regarded as a process detector. For example, in different corner cases, there are approximately several process corners, such as FF, TT, SS, etc. In different process corner cases, a transistor may have a different switch speed. As a result, the delay time of delay element of the same type may vary with the different process corners. However, the period and frequency of the input clock signal CLK1 don't vary with the different processes of the delay elements. That is, the period of the input clock signal CLK1 is fixed. So, if the delay time of the same delay element is lengthened with different processes, it represents that only smaller numbers of delay elements are needed in circuits to make the delayed signal CLKd like C2 illustrated in FIG. 2A and move rightwards to approach the transition point of the signal Cmux, such that C2 changes from being leading signal Cmux to being lagging behind signal Cmux, or make the delayed signal CLKd like C3 illustrated in FIG. 2B and move leftwards to approach the transition point of the signal Cmux, such that C3 changes from being lagging behind Cmux to being leading Cmux. For example, there is a 500-picosecond difference between the positive edges of CLKd and Cmux shown in FIG. 2A, and the delay time of a coarse delay element or a constant delay element at FF, TT, and SS process corners are 10 picoseconds, 25 picoseconds and 50 picoseconds, respectively. Thus, the circuit at FF, TT, and SS process corners needs 51, 21 and 11 delay elements, respectively, to make signal C2 change from being leading Cmux to being lagging behind Cmux. Therefore, as far as the embodiments illustrated in FIG. 1 and FIG. 3 are concerned, the control circuits 115 and 315 may find out or determine what kind of process corner the process of the circuit chip inclines to by checking the turn-on numbers of delay elements in the first delay circuits 105 and 305 (i.e. what kind of process corner may be determined according to the adjustment on the turn-on numbers of delay elements of the coarse delay circuit). In this way, the first delay circuits 105 and 305 may be regarded as equivalent to process detectors.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An apparatus for jitter measurement comprising:
   a first delay circuit, arranged to use at least one delay element of the first delay circuit to preliminarily adjust a phase delay of an input signal for generating a delayed input signal;

a second delay circuit, coupled to the first delay circuit, for operating with the first delay circuit to receive the delayed input signal from the first delay circuit, and for fine tuning the phase delay of the delayed input signal by using at least one delay element of the second delay circuit to delay the delayed input signal; and a control circuit, coupled to the first delay circuit and the second delay circuit, for controlling and adjusting amounts of delays of the first and the second delay circuits, fine tuning an amount of delay of the delayed input signal according to a unit delay of the at least one delay element of the first delay circuit and a unit delay of the at least one delay element of the second delay circuit, and estimating or calculating an amount of jitter of the input signal according to an adjustment result of the first delay circuit and an adjustment result of the second delay circuit.

2. The apparatus of claim 1, wherein the first delay circuit comprises:
a plurality of series-connected constant delay elements, each having a constant unit delay, the series-connected constant delay elements arranged to adjust the phase delay of the input signal step by step.

3. The apparatus of claim 2, wherein the second delay circuit comprises:
a plurality of series-connected first delay elements, each having a first unit delay; and
a plurality of series-connected second delay elements, each having a second unit delay;
wherein the control circuit fine tunes the phase delay of the delayed input signal according to a delay difference between the constant unit delay and the first unit delay and a delay difference between the constant unit delay and the second unit delay.

4. The apparatus of claim 3, wherein the control circuit controls a turn-on number of the constant delay elements and a turn-on number of the first delay elements, and fine tunes the phase delay of the delayed input signal to move rightwards to approach a transition point of the input signal; the control circuit controls the turn-on number of the constant delay elements and a turn-on number of the second delay elements, and fine tunes the phase delay of the delayed input signal to move leftwards to approach the transition point of the input signal; and the control circuit estimates the amount of jitter of the input signal according to amounts of changes of the turn-on number of the constant delay elements and the turn-on number of the first delay elements during a plurality of periods and amounts of changes of the turn-on number of the constant delay elements and the turn-on number of the second delay elements during the plurality of periods.

5. The apparatus of claim 4, wherein the first unit delay is smaller than the constant unit delay, and when the phase of the delayed input signal lags behind the input signal, the control circuit turns off a constant delay element and turns on a first delay element at a same time in a step-by-step manner, and fine tunes the phase of the delayed input signal to make the phase of the delayed input signal lead the input signal and move rightwards to approach the transition point of the input signal; and the second unit delay is larger than the constant unit delay, and when the phase of the delayed input signal leads the input signal, the control circuit turns off a constant delay element and turns on a second delay element at a same time in a step-by-step manner, and fine tunes the phase of the delayed input signal to make the phase of the delayed input signal lag behind the input signal and move leftwards to approach the transition point of the input signal.

6. The apparatus of claim 5, wherein when making the phase of the delayed input signal change from being lagging behind the input signal to being leading the input signal for a first time, the control circuit obtains a first fine-tuning value used for controlling the constant delay elements and the first delay elements; and if the phase of the delayed input signal lags behind the input signal during N periods of the input signal, the control circuit adjusts the first fine-tuning value to make the phase of the delayed input signal change from being lagging behind the input signal to being leading the input signal; when making the phase of the delayed input signal change from being leading the input signal to being lagging behind the input signal for a first time, the control circuit obtains a second fine-tuning value used for controlling the constant delay elements and the second delay elements, and if the phase of the delayed input signal leads the input signal during N periods of the input signal, the control circuit adjusts the second fine-tuning value to make the phase of the delayed input signal change from being leading the input signal to being lagging behind the input signal; and the control circuit calculates a first amount of jitter according to a maximum amount of change of the first fine-tuning value and the delay difference between the constant unit delay and the first unit delay, calculates a second amount of jitter according to a maximum amount of change of the second fine-tuning value and the delay difference between the constant unit delay and the second unit delay, and calculates a jitter window of the input signal according to the first amount of jitter and the second amount of jitter.

7. The apparatus of claim 3, wherein in a calibration mode, the apparatus receives three reference clock signals having different periods, respectively, and estimates the constant unit delay, the first unit delay and the second unit delay by solving three simultaneous equations of phase delays.

8. The apparatus of claim 1, wherein the first delay circuit comprises:
a plurality of series-connected coarse delay elements, each having a coarse unit delay, the series-connected coarse delay elements arranged to impose the coarse unit delay on the phase of the input signal step by step; and
a plurality of series-connected constant delay elements, each having a constant unit delay, the series-connected constant delay elements arranged to impose the constant unit delay on the phase of the input signal step by step.

9. The apparatus of claim 8, wherein the second delay circuit comprises:
a plurality of series-connected first delay elements, each having a first unit delay; and
a plurality of series-connected second delay elements, each having a second unit delay;
wherein the control circuit firstly controls the series-connected coarse delay elements and the constant delay elements to impose the phase delay composed of coarse unit delay(s) and constant unit delay(s) on the input signal, and subsequently fine tunes the phase delay of the input signal according to a delay difference between the constant unit delay and the first unit delay and a delay difference between the constant unit delay and the second unit delay.

10. The apparatus of claim 9, wherein the first unit delay is smaller than the constant unit delay, and when the phase of the delayed input signal lags behind the input signal, the control circuit turns off a constant delay element and turns on a first delay element at a same time in a step-by-step manner, and fine tunes the phase of the delayed input signal to make the phase of the delayed input signal lead the input signal and move rightwards to approach the transition point of the input signal; and the second unit delay is larger than the constant unit delay, and when the phase of the delayed input signal leads the input signal, the control circuit turns off a constant delay element and turns on a second delay element at a same time in a step-by-step manner, and fine tunes the phase of the delayed input signal to make the phase of the delayed input signal lag behind the input signal and move leftwards to approach the transition point of the input signal.

11. The apparatus of claim 9, wherein in a calibration mode, the apparatus receives four reference clock signals having different periods, respectively, and estimates the coarse unit delay, the constant unit delay, the first unit delay and the second unit delay by solving four simultaneous equations of phase delays.

12. The apparatus of claim 1, wherein the control circuit determines process variation of a circuit chip by checking a turn-on number of delay elements in the first delay circuit.

13. A method for jitter measurement comprising:
using a first delay circuit to use at least one delay element of the first delay circuit to preliminary adjust a phase delay of an input signal to generate a delayed input signal;
using a second delay circuit to operate with the first delay circuit to receive the delayed input signal from the first delay circuit and to fine tune a phase delay of the delayed input signal by using at least one delay element of the second delay circuit to delay the delayed input signal;
controlling and adjusting amounts of delays of the first and the second delay circuits, and fine tuning an amount of delay of the delayed input signal according to a unit delay of the at least one delay element of the first delay circuit and a unit delay of the at least one delay element of the second delay circuit; and
estimating or calculating an amount of jitter of the input signal according to adjustment results of a first delay line and a second delay line in the second delay circuit during a plurality of periods.

14. The method of claim 13, wherein using the first delay circuit to preliminary adjust the phase delay of the input signal comprise:
using a plurality of series-connected constant delay elements, each having a constant unit delay, to adjust the phase delay of the input signal step by step.

15. The method of claim 14, wherein using the second delay circuit to operate with the first delay circuit to fine tune the phase delay of the delayed input signal comprise:
using a plurality of series-connected first delay elements, each having a first unit delay, and using a plurality of series-connected second delay elements, each having a second unit delay; and
fine tuning the phase delay of the delayed input signal according to a delay difference between the constant unit delay and the first unit delay and a delay difference between the constant unit delay and the second unit delay.

16. The method of claim 15, further comprising:
controlling a turn-on number of the constant delay elements and a turn-on number of the first delay elements, and fine tuning the phase delay of the delayed input signal to move rightwards to approach a transition point of the input signal;
controlling the turn-on number of the constant delay elements and a turn-on number of the second delay elements, and fine tuning the phase delay of the delayed input signal to move leftwards to approach the transition point of the input signal; and
calculating the amount of jitter of the input signal according to amounts of changes of the turn-on number of the constant delay elements and the turn-on number of the first delay element during a plurality of periods and amounts of changes of the turn-on number of the constant delay elements and the turn-on number of the second delay elements during the plurality of periods.

17. The method of claim 16, wherein the first unit delay is smaller than the constant unit delay, and the second unit delay is larger than the constant unit delay, and the method further comprises:
when the phase of the delayed input signal lags behind the input signal, turning off a constant delay element and turning on a first delay element at a same time in a step-by-step manner, and fine tuning the phase of the delayed input signal to make the phase of the delayed input signal lead the input signal and move rightwards to approach the transition point of the input signal; and
when the phase of the delayed input signal leads the input signal, turning off a constant delay element and turns on a second delay element at a same time step by step in a step-by-step manner, and fine tuning the phase of the delayed input signal to make the phase of the delayed input signal lag behind the input signal and move leftwards to approach the transition point of the input signal.

18. The method of claim 17, further comprising:
when making the phase of the delayed input signal change from being lagging behind the input signal to being leading the input signal for a first time, obtaining a first fine-tuning value used for controlling the constant delay elements and the first delay elements;
if the phase of the delayed input signal lags behind the input signal during N periods of the input signal, adjusting the first fine-tuning value to make the phase of the delayed input signal change from being lagging behind the input signal to being leading the input signal;
when making the phase of the delayed input signal change from being leading the input signal to being lagging behind the input signal for a first time, obtaining a second fine-tuning value used for controlling the constant delay elements and the second delay elements;
if the phase of the delayed input signal leads the input signal during N periods of the input signal, adjusting the second fine-tuning value to make the phase of the delayed input signal change from being leading the input signal to being lagging behind the input signal;
calculating a first amount of jitter according to a maximum amount of change of the first fine-tuning value and the delay difference between the constant unit delay and the first unit delay;
calculating a second amount of jitter according to a maximum amount of change of the second fine-tuning value and the delay difference between the constant unit delay and the second unit delay; and calculating a jitter window of the input signal according to the first amount of jitter and the second amount of jitter.

19. The method of claim 15, further comprising:
in a calibration mode, receiving three reference clock signals having different periods, respectively, and estimating the constant unit delay, the first unit delay and the second unit delay by solving three simultaneous equations of phase delays.

20. The method of claim 13, wherein using the first delay circuit to preliminary adjust the phase delay of the input signal comprise:
using a plurality of series-connected coarse delay elements, each having a coarse unit delay, to impose the coarse unit delay on the phase of the input signal step by step; and
using a plurality of series-connected constant delay elements, each having a constant unit delay, to impose the constant unit delay on the phase of the input signal step by step.

21. The method of claim 20, wherein using the second delay circuit to operate with the first delay circuit to fine tune the phase delay of the delayed input signal comprise:
using a plurality of series-connected first delay elements, each having a first unit delay;
using a plurality of series-connected second delay elements, each having a second unit delay;
controlling the series-connected coarse delay elements and the constant delay elements to impose the phase delay composed of coarse unit delay(s) and constant unit delay(s) on the input signal; and
subsequently fine tuning the phase delay of the input signal according to a delay difference between the constant unit delay and the first unit delay and a delay difference between the constant unit delay and the second unit delay.

22. The method of claim 21, wherein the first unit delay is smaller than the constant unit delay, and the second unit delay is larger than the constant unit delay, and the method further comprises:
when the phase of the delayed input signal lags behind the input signal, turning off a constant delay element and turning on a first delay element at a same time in a step-by-step manner, and fine tuning the phase of the delayed input signal to make the phase of the delayed input signal lead the input signal and move rightwards to approach the transition point of the input signal;
when the phase of the delayed input signal leads the input signal, turning off a constant delay element and turning on a second delay element at a same time in a step-by-step manner, and fine tuning the phase of the delayed input signal to make the phase of the delayed input signal lag behind the input signal and move leftwards to approach the transition point of the input signal; and
estimating or calculating the amount of jitter of the input signal according to an adjustment result of the first delay circuit and an adjustment result of the second delay circuit.

23. The method of claim 21, further comprising:
in a calibration mode, receiving four reference clock signals having different periods, respectively, and estimating the coarse unit delay, the constant unit delay, the first unit delay and the second unit delay by solving four simultaneous equations of phase delays.

24. The method of claim 13, further comprising:
determining process variation of a circuit chip by checking a turn-on number of delay elements in the first delay circuit.

* * * * *